(12) United States Patent
Weale

(10) Patent No.: US 10,673,412 B1
(45) Date of Patent: Jun. 2, 2020

(54) RADIO FREQUENCY SWITCH

(71) Applicant: SEMICONDUCTOR COMPONENTS INDUSTRIES, LLC, Phoenix, AZ (US)

(72) Inventor: Gareth Pryce Weale, New Hamburg (CA)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/514,174

(22) Filed: Jul. 17, 2019

Related U.S. Application Data

(60) Provisional application No. 62/844,878, filed on May 8, 2019.

(51) Int. Cl.
| | | |
|---|---|---|
| *H03H 11/24* | (2006.01) | |
| *H03K 17/687* | (2006.01) | |
| *H03G 1/00* | (2006.01) | |
| *H03K 17/693* | (2006.01) | |
| *H03H 11/28* | (2006.01) | |
| *H04B 1/44* | (2006.01) | |

(52) U.S. Cl.
CPC .......... *H03H 11/245* (2013.01); *H03G 1/007* (2013.01); *H03K 17/687* (2013.01); *H03K 17/6871* (2013.01); *H03K 17/6874* (2013.01); *H03K 17/693* (2013.01); *H03H 11/28* (2013.01); *H03K 2017/6878* (2013.01); *H04B 1/44* (2013.01)

(58) Field of Classification Search
CPC .... H03H 11/245; H03H 11/28; H03K 17/687; H03K 17/6874; H03K 17/693; H03K 17/6871; H03K 2017/6878; H03G 1/007; H04B 1/44
See application file for complete search history.

(56) References Cited

U.S. PATENT DOCUMENTS

| | | | |
|---|---|---|---|
| 7,796,969 | B2 | 9/2010 | Kelly et al. |
| 8,334,718 | B2 * | 12/2012 | Granger-Jones ..... H03H 11/245 327/308 |
| 9,537,472 | B2 * | 1/2017 | Lu ............................. H03K 5/08 |
| 10,116,347 | B1 * | 10/2018 | Xu ........................... H04B 1/00 |
| 10,147,724 | B2 * | 12/2018 | Madan ................ H01L 27/1203 |
| 10,447,242 | B2 * | 10/2019 | Srirattana ............ H03K 17/063 |
| 2008/0064358 | A1 * | 3/2008 | Sagae ...................... H01L 21/84 455/333 |
| 2010/0225377 | A1 * | 9/2010 | Okashita .............. H03K 17/063 327/427 |
| 2013/0321095 | A1 | 12/2013 | Lam et al. |
| 2016/0134281 | A1 * | 5/2016 | Cebi ..................... H03K 17/687 327/436 |
| 2018/0234095 | A1 * | 8/2018 | Balteanu .............. H03K 17/693 |
| 2019/0199347 | A1 * | 6/2019 | Joo ....................... H03K 17/302 |
| 2019/0206863 | A1 * | 7/2019 | Blin ..................... H03K 17/102 |
| 2019/0348969 | A1 * | 11/2019 | Srirattana ............ H03K 17/063 |

* cited by examiner

*Primary Examiner* — Thomas J. Hiltunen
(74) *Attorney, Agent, or Firm* — Brake Hughes Bellermann LLP

(57) ABSTRACT

A radio frequency switch is disclosed. The RF switch uses a combination of transistor technology and a topology to create an RF switch that has a high isolation and a high voltage breakdown at frequencies including those above a gigahertz.

20 Claims, 9 Drawing Sheets

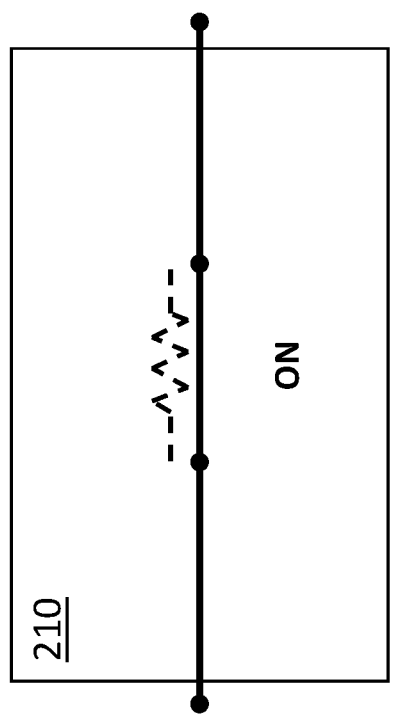
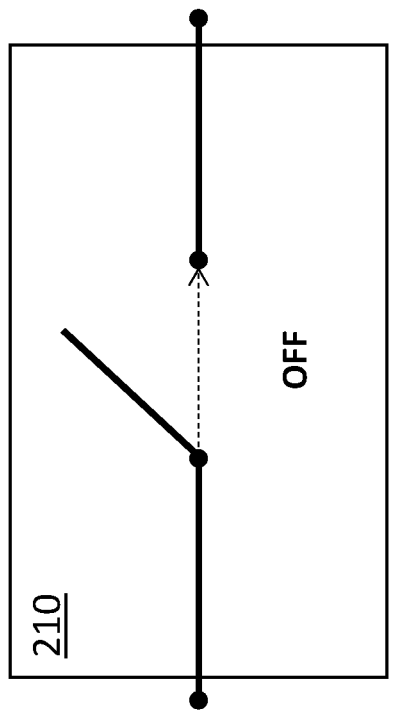

RADIO FREQUENCY SWITCH

CROSS-REFERENCE TO RELATED APPLICATIONS

This application claims the benefit of U.S. Provisional Patent Application No. 62/844,878, filed on May 8, 2019, the entire contents of which is incorporated herein by reference.

FIELD OF THE DISCLOSURE

The present disclosure relates to radio frequency (RF) devices and more specifically to an RF switch that can be used in RF tuning applications.

BACKGROUND

An RF switch is an important component for a front end portion of a wireless system, such as a handset or a base station. In particular, an RF switch may be used for impedance (i.e. feed point) tuning (i.e., matching) for maximum power transfer between a power amplifier and an antenna. Additionally, RF switches may be used for aperture tuning (i.e., matching) for maximum power transfer between an antenna and its operating environment. For example, multiple RF switches can be actively controlled ON/OFF to couple/decouple a variety of impedance combinations into a front end to optimize front end performance in response to changing operating conditions.

Many wireless applications require RF switches to be physically small, to handle high powers, and to have low power dissipation (i.e., loss). Accordingly, low insertion loss, high isolation, and high breakdown voltage are important requirements for an RF switch. Meeting all of these requirements, however, may be difficult, especially as wireless systems move to higher frequencies. A need, therefore, exists for new RF switch circuits and methods to meet the requirements of wireless systems, especially at high frequencies.

SUMMARY

In at least one aspect, the present disclosure describes a radio frequency (RF) switch. The RF switch includes a first III-V transistor that is coupled between an input of the RF switch and a shunt-connection node. The first III-V transistor is controllable by a first control signal that is applied to a gate of the first III-V transistor. The RF switch also includes a second III-V transistor that is coupled between the shunt-connection node and an output of the RF switch. The second III-V transistor is controllable by the first control signal applied to a gate of the second III-V transistor. The RF switch also includes at least one silicon-on-insulator (SOI) transistor that is coupled between the shunt-connection node and a ground. The at least one SOI transistor is controllable by a second control signal that is applied to a gate of the SOI transistor.

In various implementations the III-V transistor can be gallium arsenide (GaAs), silicon carbide (SiC), or gallium nitride (GaN).

In another aspect, the present disclosure describes an RF tuning system. The RF tuning system includes an RF switch that is configured to switch an input to one of a plurality of outputs. For each output the RF switch includes a pair of III-V switches and an SOI switch. The III-V switches are connected in series between the input and the output and are connected to each other at a shunt-connection node. The SOI switch is connected between the shunt-connection node and a ground.

In an implementation the RF tuning system, the SOI switch is a stack of SOI transistors (i.e., a plurality of series connected SOI transistors).

In another aspect, the present disclosure describes a method for switching an RF signal. The method includes applying an RF signal to an input node of an RF switch that includes two III-V switches connected in series between the input node and an output node. The two III-V switches are connected to each other at a shunt-connection node and a SOI switch is connected between the shunt-connection node and a ground. The method includes blocking the RF signal by controlling the two III-V switches to be in an OFF condition to block all but a leakage portion of the RF signal from the shunt-connection node and controlling the SOI switch to be in an ON condition to short the leakage portion of the RF signal to the ground. Alternatively, the method includes passing the RF signal by controlling the two III-V switches to be in an ON condition to pass the RF signal from the input node to the output node and controlling the SOI switch to be in an OFF condition to decouple the ground from the shunt-connection node.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 5A is a functional diagram of an RF switch in an ON condition.

FIG. 5B is a functional diagram of an RF switch in an OFF condition.

The components in the drawings are not necessarily to scale relative to each other. Like reference numerals designate corresponding parts throughout the several views.

DETAILED DESCRIPTION

The present disclosure describes an RF switch that has a high isolation, a low insertion loss, and a high breakdown voltage over a wide range of frequencies. In a non-limiting example, the disclosed RF switch may operate over a frequency range of about 500 megahertz (MHz) to 10 gigahertz (GHz) with an isolation of greater than 10 decibels (dB) (i.e., a high isolation), an insertion loss of less than 0.4 dB (i.e., a low insertion loss), and a breakdown voltage level of more than 70 volts (i.e. a high breakdown voltage). This performance is made possible the use of a combination of technologies configured in a circuit topology that uses strengths of each technology while mitigating weaknesses of each technology.

The disclosed RF switch uses a topology and a combination of switch technologies (i.e., materials) to provide a performance (e.g., insertion loss, voltage breakdown, and isolation) suitable for RF tuning applications. The topology includes two series connected transistors that couple the input of the RF switch to the output of the RF switch when the RF switch is in an ON condition. The two series connected transistors are a first material (e.g., GaN) and are connected together at a shunt-connection node. The first material switches cam provide a sufficiently low insertion loss (i.e., when ON) but may have a lower isolation (i.e., when OFF) than required by the application. Accordingly, the topology includes one or more transistors coupled between the shunt-connection node and a ground. The one or more transistors can be configured (i.e., turned ON) when the series transistors are OFF to increase the isolation of the RF switch by shorting any leakage signals to ground. The one or more transistors utilize a second material (e.g., SOI or CMOS) that can provide an isolation (i.e., when OFF) sufficiently large so that the low insertion loss of the two series connected transistors (i.e., when ON) is not significantly reduced. Further, the number of the one or more transistors may be selected based on a desired breakdown voltage. Thus, the disclosed RF switch uses the strengths of topology and material technology to provide an RF switch with desirable operating properties (e.g., at high RF frequencies and at high powers).

The RF switch of the disclosure may be used in an RF front end subsystem of a wireless system, such as a base station of a cellular network or a handset of a cellular network. In these applications, the RF switch may be used at frequencies of, for example, 900 MHz or 2.6 GHz. The RF switch may be configured to perform a function as part RF tuning system. To help understanding, the disclosed RF switch will be described in these terms. The RF switch of the disclosure is not limited, however, to these particular implementations.

Figure 1:
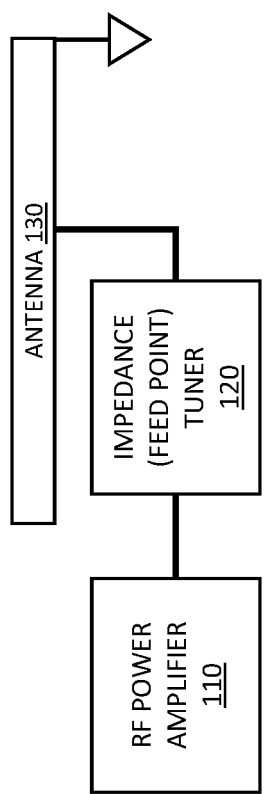
FIG. 1 is a block diagram of a wireless system including an impedance (feed point) turner according to a possible implementation of the present disclosure.

FIG. 1 is a block diagram of front end subsystem (i.e., front end) for a wireless system that includes an impedance tuner (i.e., feedpoint tuner). The front end includes an RF power amplifier 110 coupled to an antenna 130 through the impedance tuner 120. The impedance tuner 120 compensates for fluctuations of the input impedance of the antenna, for example, as a result of a changing operating environment. To minimize RF reflections (i.e., standing waves) in certain operating environments, the feedpoint impedance of the antenna is substantially matched to the output impedance of the RF power amplifier (e.g., 50 ohms). Not only can this result in optimum (i.e., maximum) power transfer from the PA to the antenna, but also minimizes the risk of damage from a high voltage created by reflections from a highly mismatched antenna. The impedance tuner typically includes impedance elements that may be coupled or decoupled to the RF circuit (i.e., switched IN/OUT of the RF circuit) until the reflections from the antenna are minimized.

Figure 2:
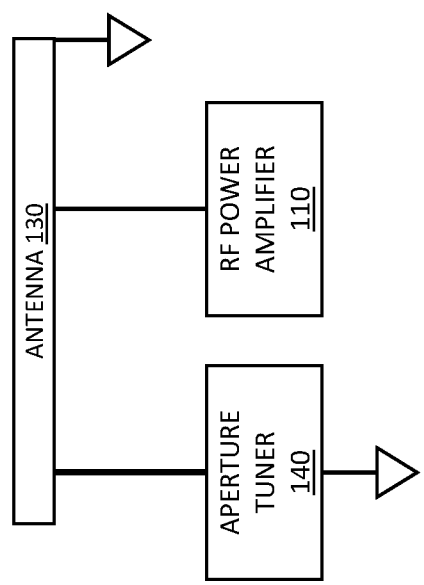
FIG. 2 is a block diagram of a wireless system including an aperture turner according to a possible implementation of the present disclosure.

FIG. 2 is a block diagram of a front end for a wireless system that includes an aperture tuner 140. The aperture tuner 140 compensates for fluctuations in a radiation efficiency of the antenna, for example, as a result of a changing operating environment (e.g., change in operating frequency). The aperture tuner 140 typically includes impedance elements that may be coupled/decoupled to/from the antenna to adjust a parameter of the antenna (e.g., an effective length). In some implementations, both an impedance tuner and an aperture tuner may be used to ensure good performance (e.g., as measured by a parameter compared to a threshold) of the front end for a variety of operating environments (e.g., range of operating frequencies).

Figure 3:
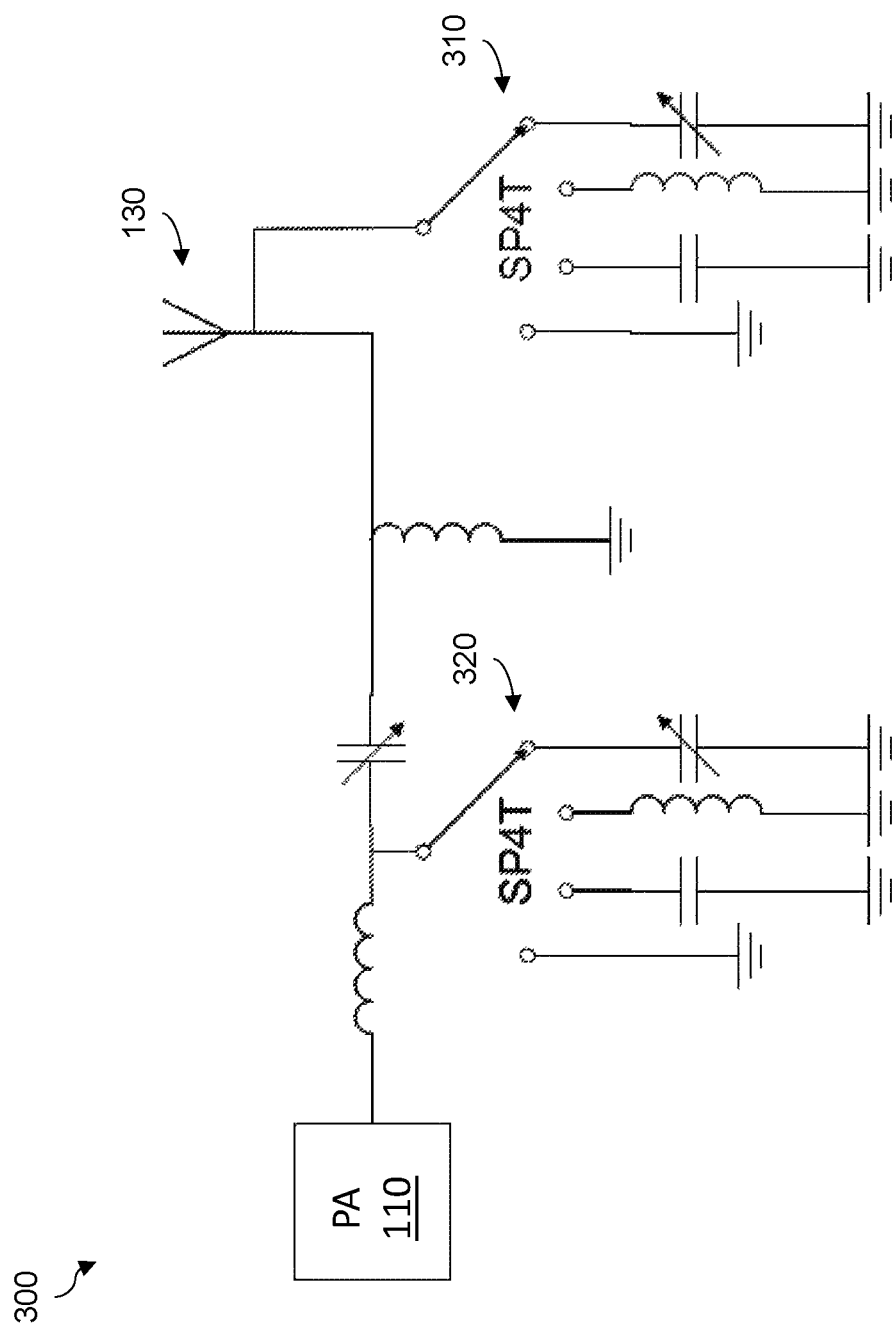
FIG. 3 is a schematic of a front end subsystem for a wireless system according to an implementation of the present disclosure

FIG. 3 is a schematic of an embodiment of a front end with an RF tuning system that includes an aperture turner 310 and an impedance tuner 320. The aperture tuner 310 and the impedance tuner 320 each include a single-pole-four-throw (SP4T) RF switch that can be configured to couple four different impedances to the front end circuit. The impedances may include an open, a short, a capacitance (e.g., a variable capacitance), or an inductance (e.g., a variable inductance). While four throws are shown for the implementation illustrated in FIG. 3, any number of terminals may be implemented. In operation, a sensing and control system (not shown) can sense a parameter of the RF circuit (e.g. a voltage standing wave ratio (VSWR)) and adjust the switch to change (e.g., to minimize) the sensed parameter.

Figure 4:
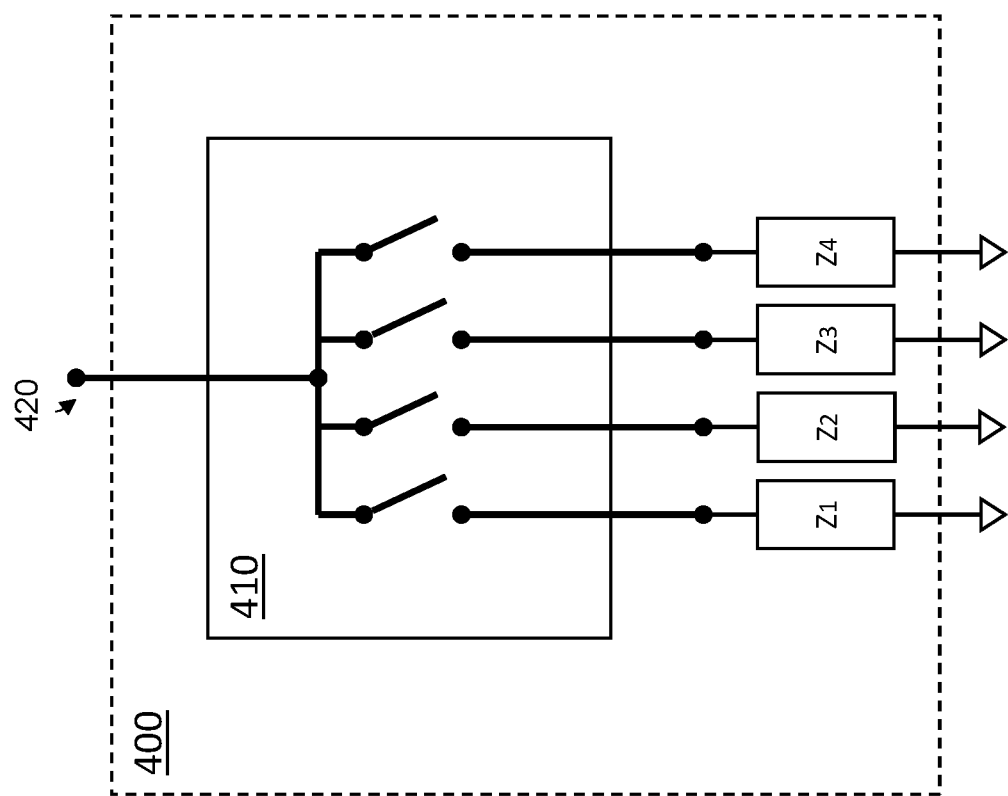
FIG. 4 is a schematic of multi switch tuner according suitable for use in a RF front end according to an implementation of the present disclosure.

The RF switch for an RF tuning system may also be implemented as a bank (i.e., array) of single-pole-single-throw (SPST) switches. FIG. 4 shows a possible implementation of an RF tuning system 400 having a bank (i.e., a plurality) of RF switches 410 each coupled to a one of a plurality of outputs, with each output coupled to a different impedance (i.e., $Z_1$, $Z_2$, $Z_3$, $Z_4$), such as those described for FIG. 3. Each switch in the bank of RF switches 410 may be controlled to be in an ON condition (i.e., shorted, closed, ON, etc.) or to be in an OFF condition (i.e., opened, OFF, etc.). For tuning, the RF switches may be controlled independently to couple some combination (e.g., parallel coupled combination) of impedances (i.e., $Z_1$, $Z_2$, $Z_3$, $Z_4$) to an input terminal 420. The input terminal (i.e., node) may be coupled to an RF front end as in FIG. 3 to operate as an impedance tuner or as an aperture turner.

As discussed, the SPST implementation of the RF switch can form the basis of a RF tuning system. The performance of the RF switch in a system (e.g., the RF tuning system) can be described by its ability to couple an RF signal in an ON condition (i.e., an ON state). FIG. 5A shows the RF switch in an ON condition. In this condition, an RF signal is coupled (e.g., capacitively coupled between an input node (i.e., input, input terminal) and an output node (i.e., output, output terminal). The RF signal ideally loses no power to the RF switch as it is coupled between the input and the output (or vice versa). Practically however, the RF switch may have some insertion loss (IL), which may place constraints on the RF switch. For example, an RF switch with an insertion loss of −0.5 dB dissipates more than a 1 W of power when conducting a 10 W RF signal. The dissipation of this amount of power places additionally requirements (e.g., size requirements) on the RF switch, which can limit its used in certain applications (e.g., mobile applications). Thus, it can be desirable to minimize IL, especially in high power RF applications, such as described previously. Additionally, having a low IL across a broad RF spectrum (i.e., wide bandwidth) offers advantages because the RF switch can operate in either large bandwidth or low bandwidth applications (e.g., without a resonant matching network).

The performance of the RF switch in a system (e.g., the RF tuning system) can also be described by its ability to block an RF signal in an OFF condition (i.e., an OFF state). FIG. 5B illustrates an implementation of an RF switch in an OFF condition. Ideally in this condition, no RF signal is coupled between the input and the output (or vice versa). In other words, the ideal RF switch in the OFF condition isolates the input and the output completely (i.e., infinitely high isolation). In practice, however, some amount of RF signal can leak from the input to the output (or vice versa). RF leakage can negatively impact an RF tuning system because the decoupling (e.g., of a tuning impedance) is not complete when an RF switch is placed in an OFF condition. As a result, the RF tuning system may not behave as designed. Thus, it can be desirable to maximize isolation (ISO) of an RF switch for applications, such as described previously.

Some additional performance parameter of an RF switch in a system (e.g., the RF tuning system) may be related to isolation. One such performance parameter is voltage hold off (i.e., voltage breakdown). A voltage applied to the RF switch may be sufficient to breakdown the high impedance provided by the switch in the OFF condition. It can be desirable to maximize the ability of the RF switch to hold off these high voltages. For example, an RF switch may need to withstand high RF voltages (e.g., >60-70 V) reflected by an impedance miss-matched (non 50 ohm) antenna driven at full power. In another example, an RF tuning system (e.g., as described previously), may experience high voltages as a results of a large voltage standing wave ratio (VSWR) created during operation (e.g., while impedances are switched to determine a match). For proper operation in such systems, it is desirable that an RF switch has a high break down voltage ($V_{BD}$) to survive such events.

Another performance parameter of an RF switch is linearity. The linearity of an RF switch can affect the output signal in a variety of ways. In an ON condition, the RF switch can couple an RF signal from an input to an output via some impedance (e.g., capacitance). The RF signal may include multiple frequencies over a bandwidth. In an ideal implementation, all constituent frequencies of the RF signal are coupled linearly from the input to the output of the switch. In practice, however, the coupling to the RF switch may not be linear so that the output RF signal is not a precise replica of the input RF signal. In other words, the output RF signal is distorted. The distortions may appear in the frequencies of the output signal as multiples (i.e., orders) of a fundamental frequency. The (higher) orders (IIP2, IIP3) may be compared to the fundamental as the RF signal power is changed to determine the linearity of the switch. Additionally, a power curve of the RF switch may be analyzed to determine a power at which the RF signal at the output is reduced from the RF signal at the input due to power nonlinearity (e.g., 0.1 dB compression point). It may be desirable that the RF switch behaves linearly for all frequencies and powers. The insertion loss of the RF switch in the ON condition may, in some conditions, be used to identify a nonlinearity because it may correspond to power lost from a fundamental frequency. Thus, an RF switch with a low insertion may be desirable from a linearity standpoint.

Figure 6A:
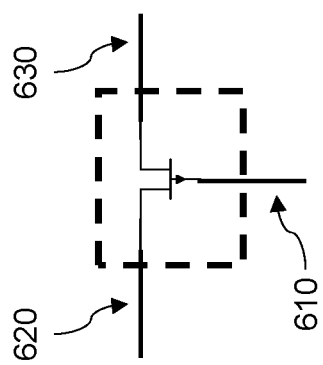
FIG. 6A is a schematic of a transistor forming a switch according to an implementation of the present disclosure.

A SPST RF switch can be implemented as a transistor. FIG. 6A is a transistor implemented as a SPST RF switch. In this implementation, a field effect transistor may be controlled ON/OFF by a voltage applied to a gate terminal 610 of the transistor to pass/block an RF signal applied to an input terminal 620 (e.g., source terminal) to/from an output terminal 630 (e.g., drain terminal). The voltage corresponding to the ON/OFF condition of the transistor is based on the type (e.g., P-type, N-type) of transistor. The RF switch may be implemented as a P-type or N-type transistor. In one possible implementation, when a first voltage is applied to a gate terminal of the transistor, the transistor is configured into an ON condition, in which a low impedance (approximately a short) path exists between the input terminal 620 and the output terminal 630 of the transistor. When a second voltage is applied to the gate terminal of the transistor, the transistor is configured into an OFF condition, in which a high impedance (e.g., approximately an open) path exists between the input terminal 620 and the output terminal 630 of the transistor.

Figure 6B:
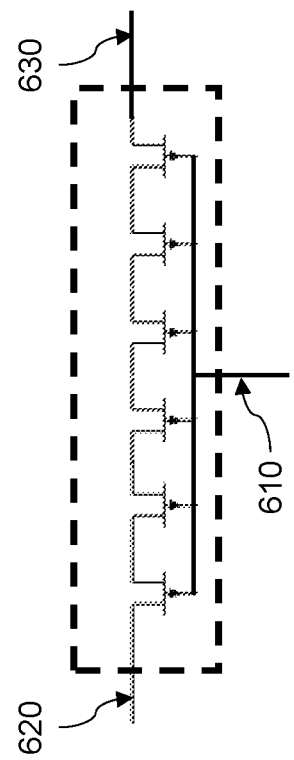
FIG. 6B is a schematic of a stack of series connected transistors forming a switch with a higher break down voltage than the switch of FIG. 6A according to an implementation of the present disclosure.

Transistors can be fabricated from materials from group IV (4) of the periodic table (e.g., Si, Ge). For example, silicon (Si) may be used as the basis of a complementary metal oxide field effect transistor (i.e., CMOS transistor). A CMOS transistor may have a low $V_{BD}$, which can be raised by using a stack of series connected transistors, as shown in FIG. 6B. As shown, the stack includes adjacent transistors are connected in series between an input terminal 620 and an output terminal 630. The transistors may be controlled simultaneously ON or OFF by applying the same signal to a gate of each transistor in the stack. A voltage appearing across the stack is divided between the transistors in the stack so that a particular transistor of the stack receives a reduced (i.e., series divided) voltage. For example, the switch including a stack of transistors (FIG. 6B) increases $V_{BD}$ by a factor of six (i.e., the count of transistors in the stack) as compared to the RF switch including a single transistor (FIG. 6A).

An insertion loss for a stack of transistors is proportional to a number (i.e., a count) of transistors in the stack. Accordingly, while using a stack series connected transistors can increase $V_{BD}$, it may increase an overall insertion loss. The performance (e.g., insertion loss) of a CMOS switch may be further degraded as the RF frequency is raised. As a result, CMOS transistors are typically used at lower frequencies (e.g., less than about 1 GHz).

The performance of a silicon (Si) based transistor at higher frequencies may be improved by the choice of transistor technology. Silicon-on-insulator (SOI) is a transistor architecture (i.e., technology) Compared to a CMOS switch, an RF switch implemented as an SOI transistor may have less insertion loss and more isolation than a CMOS transistor at frequencies above 1 GHz (e.g., in a range of 1 GHz to 3 GHz). Additionally, SOI transistors may have a smaller size (i.e., than a comparable CMOS) and a more power handling capability (e.g. 1 W). For at least these reasons, an RF switch may be implemented as a SOI transistor in some mobile applications (e.g., cellular handset).

RF switches (i.e., switches, switching devices) may also be implemented as transistors fabricated from a compound containing elements from group III (3) and group V (5) of the periodic table. Switching devices made from these materials are known generally as "III-V" switching devices. When the switching device is a transistor, it may be referred to as a "III-V" transistor. The precise choice of III-V materials may be based on a variety of requirements including (but not limited to) operating frequency and operating power. Some possible III-V transistors that may be used in implementations of the present disclosure may include (but are not limited to) gallium arsenide (GaAs), silicon carbide (SiC) and gallium nitride (GaN).

While SOI offers a higher $V_{BD}$ than CMOS, a (lossy) stack of SOI transistors may still be needed to hold off voltages associated with tuning applications. An RF switch using III-V material transistors can hold off a voltage associated with a tuning application using a stack with fewer transistors than an equivalent RF switch using SOI transistors. GaN transistors have excellent (e.g., high) $V_{BD}$ properties but can have poor (e.g., low) isolation due to a large capacitance between a source terminal and a drain terminal in an OFF condition. In other words, RF signals can be coupled through the capacitance resulting in a low isolation GaN switch. The SOI switch may have a higher isolation than the GaN switch but may have a lower $V_{BD}$ than t the GaN switch. In other words, a GaN switch may have a relatively high voltage breakdown but a relatively low isolation, while a SOI switch may have a relatively high isolation (e.g., in a stacked configuration) but a relatively low voltage breakdown. The disclosed RF switch uses a particular topology and combination of switch technologies (i.e., materials) to provide a voltage breakdown and an isolation suitable for RF tuning applications.

Figure 7:
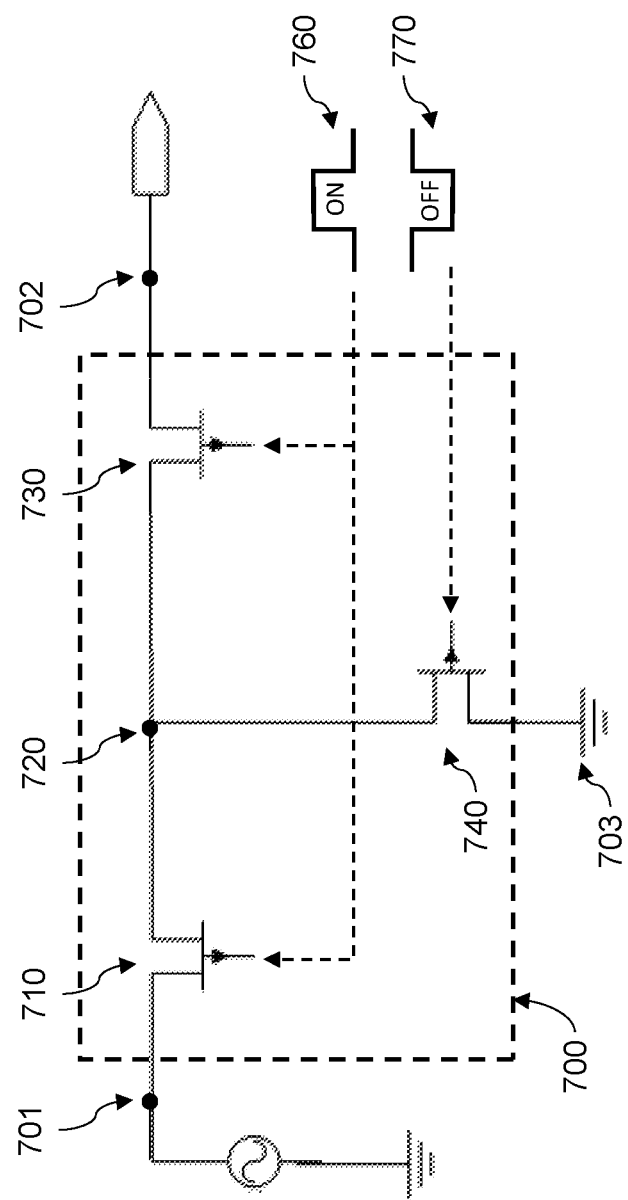
FIG. 7 is a schematic of an RF switch according to a first possible implementation of the present disclosure.

An RF switch according to a possible implementation of the present disclosure is shown in FIG. 7. The RF switch 700 is coupled to a source at an input node (i.e., input) 701 and coupled to a load at an output node (i.e., output) 702. A first III-V switch 710 (e.g., a first GaN transistor) is coupled between the input 701 (e.g., at a source terminal) and a shunt-connection node 720 (e.g., at a drain terminal). A second III-V switch 730 (e.g., a second GaN transistor) is coupled between the shunt-connection node 720 (e.g., at a source terminal) and the output node (i.e., output) 702 (e.g., at a drain terminal). The first III-V switch and the second III-V switch are controlled to have the same ON/OFF state with a first control signal (i.e., first signal) 760 applied to a gate of each switch. The ON state of each switch may correspond to a voltage of the signal above a threshold and the OFF state may correspond to a voltage of the first signal 760 below a threshold, or vice versa.

The RF switch 700 also includes an SOI switch 740 that is coupled between the shunt-connection node 720 and a ground node (i.e., ground) 703. The ON/OFF state of the SOI switch 740 is controlled with a second control signal (i.e., second signal) 770 applied to the gate of the SOI switch 740. The second signal 770 and the first signal 760 can be complementary ON/OFF signals. The ON/OFF state of the SOI switch is opposite to the states of the first III-V switch 710 and the second III-V switch 730.

The RF switch 700 may be turned ON to conduct an RF signal between the input 701 and the output 702 by configuring the first III-V switch 710 and the second III-V switch 730 in an ON state and the SOI switch in an OFF state. The SOI technology has excellent isolation in the OFF state. As a result, there can be very little leakage of the RF signal to ground so the overall insertion loss of the switch remains low.

The RF switch 700 may be turned OFF to block an RF signal between the input 701 and the output 702 by configuring the first III-V switch 70 and the second III-V switch 730 in the OFF state and the SOI switch in the ON state. As mentioned, in the OFF state, III-V switches may have leakage. For example, a leakage portion of an RF signal applied to the input 701 may leak through the source-drain capacitance of the first III-V switch. In this scenario, the SOI switch in the ON state shorts the leakage portion to ground. As a result, the isolation of the RF switch 700 is increased.

As mentioned, a III-V switch has a high $V_{BD}$. The $V_{BD}$ is made even higher through the series stack formed by the first III-V switch 710 and the second III-V switch 730. The SOI switch has a lower $V_{BD}$ but the SOI switch is partially shielded from the voltage appearing at the input (or output) of the RF switch. For example, if the first III-V switch 710 is broken down there is a voltage drop between the source and the drain of the first III-V switch that reduces voltage appearing at the shunt-connection node 720. Thus, the breakdown voltage requirement of the SOI switch 740 can be reduced.

Figure 8:
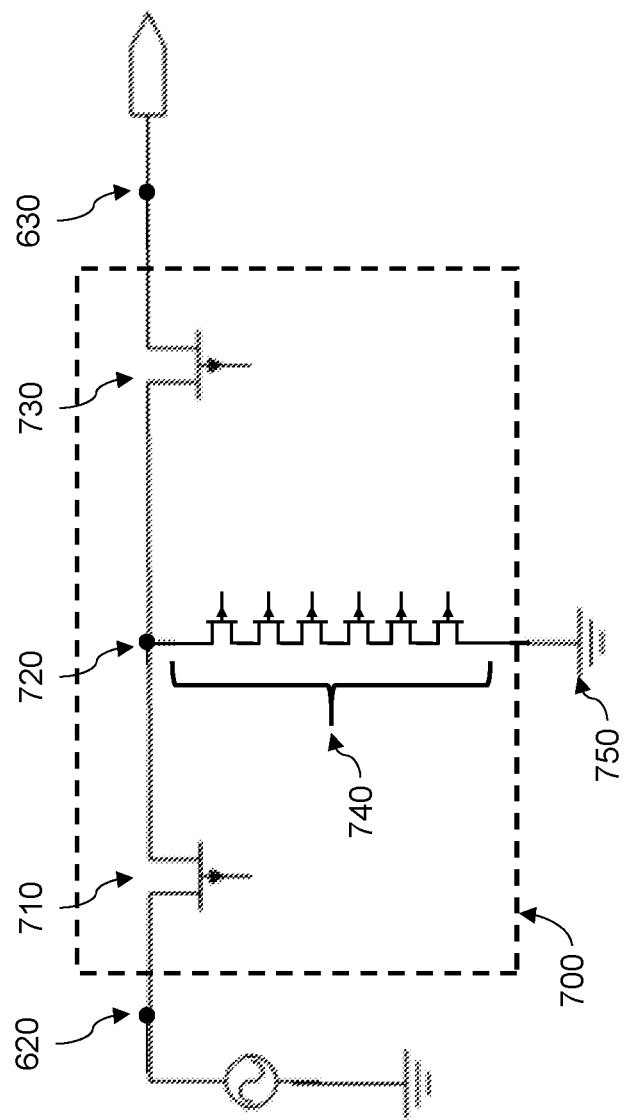
FIG. 8 is a schematic of an RF switch according to a second possible implementation of the present disclosure.

An RF switch according to another possible implementation of the present disclosure is shown in FIG. 8. The SOI switch of the RF switch 700 is implemented as a stack of SOI switches 740 in order to improve the breakdown voltage of the SOI switch. As described above, if the first III-V switch 710 is broken down, then a voltage corresponding to the break down voltage of the first III-V switch appears at the shunt-connection node 720. Accordingly, the number of SOI transistor in the stack of SOI transistor can be selected to hold off this voltage. In other words, the number of SOI transistors in the stack may be based on (i.e., corresponding to) a breakdown voltage of one of the pair of III-V switches. In operation, the stack of the SOI switches are controlled to all be in an ON condition when the RF switch OFF and when the RF switch is ON, the stack of the SOI switches are control to all be in an OFF condition.

Figure 9:
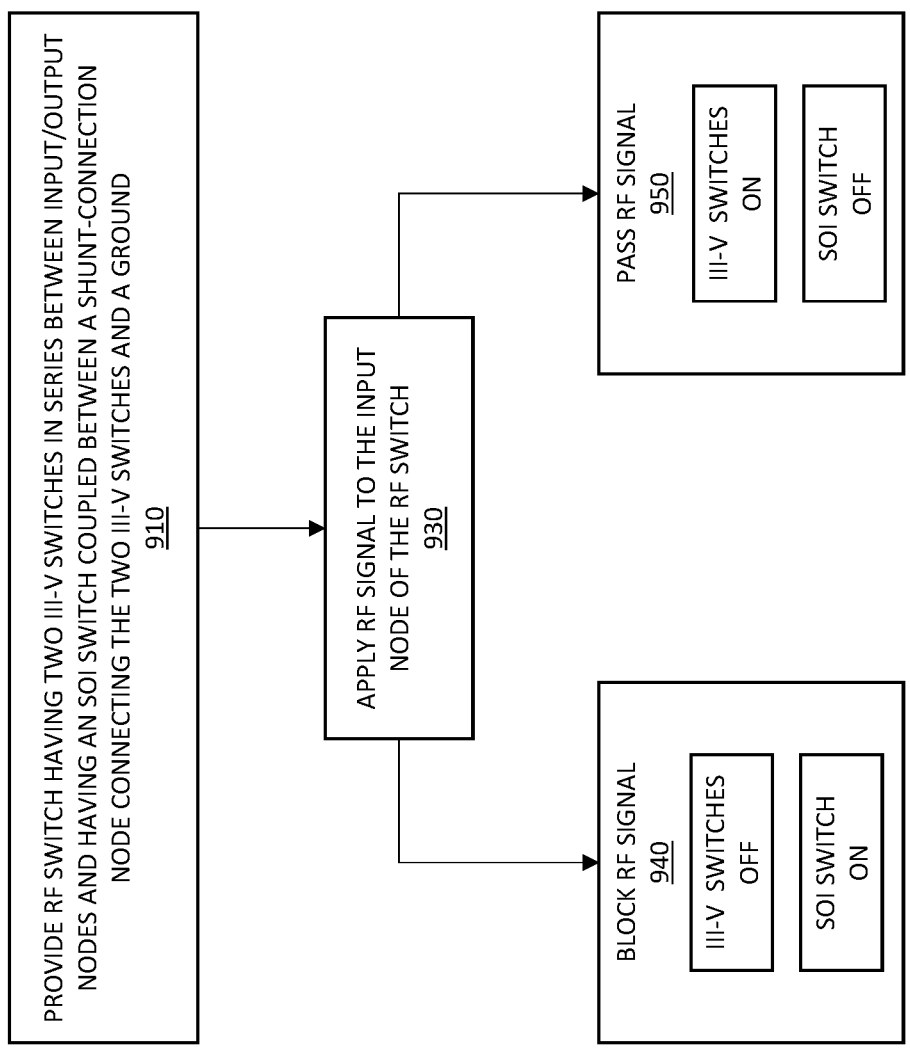
FIG. 9 is a flowchart of a method for switching RF according to an implementation of the present disclosure.

FIG. 9 is a flowchart of a method for switching RF according to an implementation of the present disclosure. The method includes providing 910 an RF switch having two III-V switches connected in series between an input node and an output node. The III-V switches may be implemented as GaN transistors. The transistors are connected to each other at a shunt-connection node. The RF switch also includes an SOI switch connected between the shunt-connection node and a ground so that when the SOI switch is turned ON, RF signals at the shunt-connection node (e.g., via leakage) are grounded instead of appearing at the output node of the RF switch. The method also includes applying 930 an RF signal to the input of the RF switch The method includes blocking 940 an RF signal by turning the III-V switches OFF and the SOI switch ON or passing 950 the RF signal by turning the III-V switches ON and the SOI switch OFF.

Through the combination of transistor technologies (e.g., SOI, GaN) and the stacked and shunted topology, the RF switch of the disclosure can offer a high break down voltage and a high isolation for wide range of frequencies. For example, the RF switch may operate over a range from about 0.5 GHz to about 10 GHz with excellent performance. The RF switch may operate at even high frequencies (e.g., up to 20 GHz) if performance requirements are less critical.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

The invention claimed is:

1. A radio frequency (RF) switch comprising:
   a first III-V transistor coupled between an input of the RF switch and a shunt-connection node, the first III-V transistor controllable by a first control signal applied to a gate of the first III-V transistor;
   a second III-V transistor coupled between the shunt-connection node and an output of the RF switch, the second III-V transistor controllable by the first control signal applied to a gate of the second III-V transistor; and
   at least one silicon on insulator (SOI) transistor coupled between the shunt-connection node and a ground, the at least one SOI transistor controllable by a second control signal applied to a gate of the at least one SOI transistor.

2. The RF switch according to claim 1, wherein the first III-V transistor and the second III-V transistor are gallium arsenide (GaAs).

3. The RF switch according to claim 1, wherein the first III-V transistor and the second III-V transistor are silicon carbide (SiC).

4. The RF switch according to claim 1, wherein the first III-V transistor and the second III-V transistor are gallium nitride (GaN).

5. The RF switch according to claim 1, wherein the first control signal and the second control signal are complementary ON/OFF signals that control the RF switch in an ON state or an OFF state.

6. The RF switch according to claim 5, wherein in the ON state
   the first III-V transistor and the second III-V transistor are ON to create a low impedance path between the input and the output of the RF switch; and
   the at least one SOI transistor is OFF to isolate ground from the low impedance path.

7. The RF switch according to claim 5, wherein in the OFF state
   the first III-V transistor and the second III-V transistor are OFF to create a high impedance path between the input and the output; and
   the at least one SOI transistor is ON to short the high impedance path to ground.

8. The RF switch according to claim 1, wherein a breakdown voltage of the first III-V transistor and the second III-V transistor is higher than a breakdown voltage of the at least one SOI transistor.

9. The RF switch according to claim 8, wherein the at least one SOI transistor is coupled to a voltage that is lower than a voltage coupled to first III-V transistor or the second III-V transistor.

10. The RF switch according to claim 1, wherein the at least one SOI transistor is a stack of SOI transistors connected in series.

11. The RF switch according to claim 10, wherein a number of SOI transistors in the stack corresponds to a break down voltage of the first III-V transistor or the second III-V transistor.

12. The RF switch according to claim 1, wherein a frequency of an input signal to the RF switch is in a range between and including 0.5 gigahertz and 10 GHz.

13. An RF tuning system comprising:
    an RF switch configured to switch an input to one of a plurality of outputs, and for each output the RF switch includes:
      a pair of III-V switches connected in series between the input and the output, the pair of III-V switches connected to each other at a shunt-connection node; and
      an SOI switch connected between the shunt-connection node and a ground.

14. The RF tuning system according to claim 13, wherein the pair of III-V switches include;
    a first GaN transistor coupled between the input and the shunt-connection node; and
    a second GaN transistor coupled between the shunt-connection node and the output.

15. The RF tuning system according to claim 13, wherein the SOI switch is a stack of SOI transistors.

16. The RF tuning system according to claim 15, wherein a count of SOI transistors in the stack of SOI transistors corresponds to a breakdown voltage of one of the pair of III-V switches.

17. The RF tuning system according to claim 13, wherein the RF switch is configured to switch the input to a particular output when the pair of III-V switches corresponding to the particular output are in an ON condition and the SOI switch corresponding to the particular output is in an OFF condition.

18. The RF tuning system according to claim 13, wherein the RF switch is configured to isolate the input from a particular output when the pair of III-V switches corresponding to the particular output are in an OFF condition and the SOI switch corresponding to the particular output is in an ON condition.

19. A method for switching an RF signal, the method comprising:
    applying an RF signal to an input node of an RF switch that includes two III-V switches connected in series between the input node and an output node, the two III-V switches connected to each other at a shunt-connection node; and
    blocking the RF signal by:
      controlling the two III-V switches to be in an OFF condition to block all but a leakage portion of the RF signal from the shunt-connection node, and
      controlling an SOI switch that is coupled between the shunt-connection node and a ground to be in an ON condition to short the leakage portion of the RF signal to the ground.

20. The method for switching an RF signal according to claim 19, further comprising:
    passing the RF signal by:
      controlling the two III-V switches to be in the ON condition to pass the RF signal from the input node to the output node, and
      controlling the SOI switch to be in the OFF condition to decouple ground from the shunt-connection node.

* * * * *